United States Patent
Suyama

(10) Patent No.: US 7,046,579 B2
(45) Date of Patent: May 16, 2006

(54) SEMICONDUCTOR STORAGE DEVICE

(75) Inventor: Noriaki Suyama, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 29 days.

(21) Appl. No.: 10/872,570

(22) Filed: Jun. 22, 2004

(65) Prior Publication Data
US 2005/0002259 A1 Jan. 6, 2005

(30) Foreign Application Priority Data
Jul. 1, 2003 (JP) ............................. 2003-270228

(51) Int. Cl.
G11C 8/00 (2006.01)
(52) U.S. Cl. ..................................... 365/233; 365/222
(58) Field of Classification Search ................ 365/233, 365/222
See application file for complete search history.

(56) References Cited

U.S. PATENT DOCUMENTS 4,412,314 A * 10/1983 Proebsting .................. 365/222
5,262,998 A * 11/1993 Mnich et al. ................ 365/222
6,026,029 A * 2/2000 Dosaka et al. ......... 365/189.01

FOREIGN PATENT DOCUMENTS

JP 2002-184180 6/2002
JP 2003-85970 3/2003

OTHER PUBLICATIONS

Data Sheet Elpida, 128M bits Mobile RAM, Document No. E0195E50 (Ver.5.0) p. 43.

* cited by examiner

Primary Examiner—M. Tran
(74) Attorney, Agent, or Firm—Young & Thompson

(57) ABSTRACT

The semiconductor storage device has a clock input buffer to output an internal clock signal INCLK, a NOT circuit to receive an external signal /CS, and an OR circuit to receive the output of the NOT circuit and a refresh request signal RFR and output their logical sum as an internal clock enable signal INCE to the clock input buffer. The clock input buffer has a NAND circuit to receive a clock signal CLK and the internal clock enable signal INCE and output an inverted signal of their logical product.

15 Claims, 17 Drawing Sheets

PRIOR ART

SEMICONDUCTOR STORAGE DEVICE

BACKGROUND OF THE INVENTION

1. Field of the Invention

The present invention relates to a semiconductor storage device having a memory cell array composed of dynamic random access memory (DRAM) and a timer for executing refresh operation according to a timer period.

2. Description of a Related Art

As more features and functions are implemented in mobile devices such as cellular phones, a demand for higher capacity random access memory (RAM) is rapidly growing.

Thus, there arises a need for using RAM with high capacity and low current consumption instead of conventionally used asynchronous static random access memory (SRAM) with relatively low current consumption. To meet this need, asynchronous pseudo-SRAM (PSRAM) that combines the best properties of the asynchronous SRAM for easy system design and DRAM for easy capacity increase is increasingly used for mobile devices (see Japanese Unexamined Patent Application Publication 2003-85970). The asynchronous PSRAM is a semiconductor storage device of which memory cell array is composed of DRAM cells and which has an asynchronous SRAM external interface.

FIG. 15 is a block diagram showing the conventional semiconductor storage device described in the above conventional art. This conventional semiconductor storage device has a memory cell array 5 for storing data. The memory cell array 5 is an array of areas having a DRAM cell, and it is a collection of capacitor cells. A chip select signal /CS is an external signal to control the semiconductor storage device. If the external signal /CS is High, the semiconductor storage device is in stand-by mode; if it is Low, the device is in normal operation mode for data reading or writing.

The semiconductor storage device also has a refresh request signal generation timer 1. The refresh request signal generation timer 1 automatically sets a refresh request signal RFR to High at such a period as to allow the memory cell array 5 to retain data. The external signal /CS and the refresh request signal RFR are input to an AND circuit 9. The AND circuit 9 generates High level of output signal E when the external signal /CS is High; thus the device is in stand-by mode, and the refresh request signal RFR is High.

The output signal E of the AND circuit 9 is input to a control signal generation block 2, which serves as a refresh operation unit. The control signal generation block 2 outputs High level of refresh control signal D when the output signal E from the AND circuit 9 is High. On the other hand, the external signal /CS is input to a control signal generation block 3. The control signal generation circuit 3 outputs High level of read/write control signal C when the external signal /CS is Low and the device is in the normal operation mode.

The refresh control signal D and the read/write control signal C are input to a memory cell array control signal generation block 4. The memory cell array control signal generation block 4 outputs a memory array core control signal MCC to the memory cell array 5 when the refresh control signal D is High or the read/write control signal C is High so as to perform refresh operation or read/write operation in the memory cell array 5.

The semiconductor storage device also has a refresh address 7, a multiplexer MUX 8, and a data input/output buffer 6. The refresh address 7 receives the refresh control signal D and outputs addresses A0 to Am to the multiplexer 8 when the refresh control signal D is High. The multiplexer 8 receives the refresh control signal D, the addresses A0 to Am, and external signals ADD0 to ADDm. In the refresh operation mode when the refresh control signal D is High, the multiplexer 8 sequentially selects each address from the addresses A0 to Am and outputs the addresses as signals B0 to Bm to the memory cell array 5 so as to perform the refresh operation in the cells of the memory cell array 5 specified by the signals B0 to Bm. In the read/write operation mode when the refresh control signal D is Low, on the other hand, the multiplexer 8 selects each address from the external signals ADD0 to ADDm and outputs the addresses as signals B0 to Bm so as to perform the read/write operation in the cells specified by the signals B0 to Bm. Further, in the read operation, the data input/output buffer 6 receives data DATA0 to DATAn output from the memory cell array 5, buffers the data, and outputs the data as external signals DQ0 to DQn. In the write operation, on the other hand, the buffer 6 receives external signals DQ0 to DQn from outside, buffers the signals, and outputs them as data DATA0 to DATAn to the memory cell array 5.

The operation of the conventional semiconductor storage device is explained below. FIGS. 16A and 16B are timing charts showing the operations of the above conventional semiconductor storage device and another conventional semiconductor storage device, which is described later, respectively. First, the refresh operation is explained. The external signal /CS is High and the device is thus in stand-by mode. In this state, the refresh signal generation timer 1 generates a refresh request signal RFR. Since the external signal /CS is High and the refresh request signal is also High, the output signal E of the AND circuit 9 is High. The control signal generation block 2 thereby outputs High level of refresh control signal D. Then, the memory cell array control signal generation block 4 outputs High level of memory array core control signal MCC, the refresh address 7 outputs addresses A0 to Am to be refreshed, and the multiplexer 8 sequentially selects the addresses A0 to Am and outputs signals B0 to Bm to the memory cell array 5. The refresh operation is thereby performed in the cells of the memory cell array 5 specified by the signals B0 to Bm.

The read operation is explained below. The read operation is performed during the normal operation mode where the external signal /CS is Low. Thus, the output signal E of the AND circuit 9 is always Low not to perform the refresh operation. The control signal generation block 3 outputs a read control signal C to the memory cell array control signal generation block 4 and the memory cell array 5. The memory cell array control signal generation block 4 thereby outputs High level of memory array core control signal MCC. In this state, external signals ADD0 to ADDm are input to the multiplexer 8, which then sequentially selects each signal from the external signals ADD0 to ADDm and outputs them as signals B0 to Bm to the memory cell array 5. The read operation is thereby performed in the cells of the memory cell array 5 specified by the signals B0 to Bm. The read data is input as DATA0 to DATAn to the data input/output buffer 6, which buffers and outputs the data as external signals DQ0 to DQn.

The write operation is explained below. The write operation is also performed during the normal operation mode where the external signal /CS is Low. The control signal generation block 3 outputs a write control signal C to the memory cell array control signal generation block 4 and the memory cell array 5. The memory cell array control signal generation block 4 thereby outputs High level of memory array core control signal MCC. In this state, external signals ADD0 to ADDm are input to the multiplexer 8, which then sequentially selects each signal from the external signals ADD0 to ADDm and outputs them as signals B0 to Bm to the memory cell array 5. At the same time, external signals DQ0 to DQn are input to the data input/output buffer 6, which buffers and outputs the data as data DATA0 to DATAn to the memory cell array 5. The data DATA0 to DATAn is thereby written to the cells of the memory cell array 5 specified by the signals B0 to Bm. The memory array core control signal MCC is High in the read and write operations.

It is impossible to perform the refresh operation and the read/write operation in parallel. In a general DRAM cell array, it is impossible to perform a sequence of operations of word selection, destructive data reading, data amplification, data writing, and word unselection in parallel on one area.

FIG. 16A shows the operation waveform of the conventional semiconductor storage device performing the refresh operation and the read operation successively. In this example, the external signal /CS is High in the initial state. The refresh request signal RER is generated, which is, turned to High, at a constant period regardless of an external state. Thus, the output signal E can be generated (turned to High) in all the period when the external signal /CS is High, which is, the period corresponding to the shaded area in FIG. 16A. If the output signal E becomes High in the posterior edge of the shaded area, immediately before the external signal /CS changes from High to Low, the refresh control signal D changes from Low to High accordingly, thereby starting the refresh operation. The memory array core control signal MCC stays High during the refresh operation. Thus, the read operation cannot be started until the refresh operation ends. After the refresh operation ends and the refresh control signal D changes from High to Low, the read control signal C changes from Low to High, starting the read operation. The memory array core control signal MCC stays High during the read operation. In this way, since the device cannot start the read operation until the refresh operation is over, it is necessary to wait for a time period indicated by A0 in FIG. 16A, at maximum, after the external signal /CS changes to Low until the read operation is started.

As described above, the conventional semiconductor storage device shown in FIG. 15 has a problem that, when performing the read operation after the refresh operation, there can be a considerable wait time before starting the read operation depending on timing to start the refresh operation.

Since more and more features and functions will be implemented, semiconductor storage devices should be capable of not only higher density packaging but also higher speed read/write operation. However, such semiconductor storage devices as shown in FIG. 15 are incapable of the high speed operation since the start of the read operation delays due to the refresh operation.

One solution for achieving the high speed read/write operation in the conventional semiconductor storage device shown in FIG. 15 is to apply a general synchronization technique. FIG. 17 is a block diagram showing a semiconductor storage device to which synchronization is applied to enhance high speed operation. In this semiconductor storage device, the same elements as in the semiconductor storage device of FIG. 15 are denoted by the same reference symbols and redundant description is omitted. This semiconductor storage device is different from the semiconductor storage device of FIG. 15 in the part enclosed by a frame 11 in FIG. 17. This semiconductor storage device has a clock input buffer 10 to receive a clock signal CLC from outside, generate an internal clock signal INCLK based on the input clock signal CLK, and output INCLK toward the control signal generation blocks 2 and 3. Except for this, the structure of this semiconductor storage device is the same as that of the semiconductor storage device shown in FIG. 15.

The operation of the semiconductor storage device shown in FIG. 17 is explained hereinafter. A clock signal CLK is input to the clock input buffer 10 from outside. The clock input buffer 10 buffers the clock signal CLK to generate an internal clock signal INCLK and outputs INCLK to the control signal generation blocks 2 and 3. If the external signal /CS is High and the refresh request signal RFR is also High, the control signal generation block 2 generates a refresh control signal D, that is, sets the refresh control signal D to High in synchronization with the internal clock signal INCLK, thereby starting the refresh operation in the memory cell array 5. If, on the other hand, the external signal /CS is Low, the control signal generation block 3 generates a read/write control signal C, that is, sets the read/write control signal C to High in synchronization with the internal clock signal INCLK, thereby starting the read/write operation in the memory cell array 5.

FIG. 16B shows the operation waveform of this conventional synchronized semiconductor storage device performing the refresh operation and the read operation successively. In this example, the external signal /CS is High in the initial state. The refresh request signal RER becomes High at a constant period regardless of an external state. Thus, the output signal E can become High in all the period when the external signal /CS is High, which is, the period corresponding to the shaded area in FIG. 16B.

This semiconductor storage device synchronizes the refresh control signal D with the internal clock signal INCLK in the control signal generation block 2. Thus, if the refresh request signal RFR becomes High and the output signal E thereby becomes High after the internal clock signal INCLK rises for the last time in the period when the external signal /CS is High, which is, the period corresponding to the shaded area in FIG. 16B, the refresh control signal D does not rise, not starting the refresh operation. In other words, the refresh operation is started only when the refresh request signal RFR becomes High before the internal clock signal INCLK rises for the last time. Hence, as shown in FIG. 16B, a wait time from High to Low change in the external signal /CS to the start of read operation starts is A1 at maximum. Comparing FIGS. 16A and 16B, the wait time A1 in the synchronization operation is shorter than the wait time A0 in the non-synchronization operation. This is the same when performing the write operation after the refresh operation.

In this way, by applying a general synchronization technique to the conventional semiconductor storage device, it is possible to reduce the wait time by the length of A2=A0−A1 to speed up the read/write operation. If the refresh request signal RFR becomes High after the last time the internal clock signal INCLK rises, the refresh operation is not performed in this timing but is postponed until the next time. The period of the refresh operation is about 50 µs (microseconds), for example, and the period to require the refresh operation in DRAM is about 100 ms (milliseconds) at maximum, for example. Thus, data stored in the memory cell array is not erased even if the refresh operation is postponed once.

The synchronized semiconductor storage device shown in FIG. 17, however, has a problem that the higher speed operation by the synchronization causes an increase in current consumption in stand-by mode. This semiconductor storage device generates the internal clock signal INCLK for the synchronization of the refresh operation. Thus, extra current is consumed for the operation of the internal clock signal INCLK. FIG. 18 is a timing chart showing the operation waveform of the semiconductor storage device shown in FIG. 17 in the stand-by mode when the external signal /CS is High. The refresh request signal RFR is generated about every 50 μs. As shown in FIG. 18, the internal clock signal INCLK keeps operating during the period where the refresh control signal D is not generated, consuming current.

Recently, such semiconductor storage devices as shown in FIG. 17 are often used as memory of mobile devices. In cellular phones, for example, which are typical of the mobile devices, it is extremely important to reduce the battery consumption in stand-by more to increase an operable time. Thus, a semiconductor storage device with a large capacity and low current consumption in stand-by mode and capable of high speed read/write operation is demanded for the memory in the mobile devices. Though the semiconductor storage device of FIG. 17 allows the high speed operation, it has high power consumption, as described above.

To solve this problem, a semiconductor storage device in which a clock signal is partly stopped in the stand-by mode has been proposed (see Japanese Unexamined Patent Application Publication 2002-184180, FIGS. 2 and 7, for example). According to this technique, in a synchronized DRAM, there are provided a clock input buffer to receive a clock signal from outside and distribute the clock signal to internal components, a command input buffer to input a command in synchronization with the clock signal, an address input buffer to input an address in synchronization with the clock signal, and a data input buffer to input data in synchronization with the clock signal. In data retention mode, the clock signal is supplied only to the command input buffer, not to the address input buffer and the data input buffer.

This conventional technique, however, has the following problem. Though this semiconductor storage device can stop the supply of the clock signal to the address input buffer and the data input buffer in data retention mode, it cannot stop the supply of the clock signal to the command input buffer since it is necessary to perform the refresh operation in the data retention mode, requiring the command for controlling the refresh operation. Thus, a certain amount of current is consumed in the data retention mode.

This problem will be solved if the above semiconductor storage device contains a self timer to periodically perform the refresh operation since this eliminates the need to input the command for controlling the refresh operation from outside and allows stopping the supply of the clock signal to the command input buffer. However, this structure causes delay in receiving the command when shifting from the data retention mode to the normal operation mode, as described in DATA SHEET ELPIDA 128 M bits Mobile RAM Document No. E0195E50 (Ver.5.0), P.43, tRC1 spec in the figure of Self Refresh (Entry and Exit). Consequently, the read operation delays to impede high speed operations.

SUMMARY OF THE INVENTION

In view of the foregoing, it is an object of the present invention to provide a semiconductor storage device with a self refresh function, having a memory array composed of DRAM, capable of high speed and low current consumption operations.

To these ends, according to one aspect of the present invention, there is provided a first semiconductor storage device for performing data read/write operation in normal operation mode and stopping the data read/write operation in stand-by mode, including memory for storing data, refreshed to retain the stored data; and a clock input buffer for generating an internal clock signal, stopping generation of the internal clock signal in absence of refresh request of the memory in the stand-by mode. Since the clock input buffer does not generate the internal clock signal when the refresh of the memory is not requested in the stand-by mode, it is possible to reduce current consumption in the stand-by mode.

The above semiconductor storage device may further include a memory cell array for storing data; a refresh timer for outputting a refresh request signal to request refresh of the memory cell array at a constant period; and a refresh operation unit for refreshing the memory cell array in synchronization with the internal clock signal upon input of the refresh request signal in the stand-by mode, wherein the clock input buffer generates the internal clock signal based on an external clock signal input from outside. Since the refresh operation unit refreshes the memory cell array in synchronization with the internal clock signal, it is possible to prevent the refresh operation from starting immediately before the mode shift from the stand-by mode to the normal operation mode, thus reducing a wait time for the read/write operation to enhance higher speed operation.

In the above semiconductor storage, the clock input buffer may stop generation of the internal clock signal based on a logical operation result between a binary signal indicating the normal operation mode or the stand-by mode and a binary signal indicating a presence of refresh request. Preferably in the above semiconductor storage, the clock input buffer prevents hazard from occurring in the internal clock signal. This allows further enhancing the higher speed operation of the semiconductor storage device.

In the above semiconductor storage, the clock input buffer may not change the internal clock signal to High upon refresh request in a timing when the external clock signal is High, but may change the internal clock signal to High in response to a subsequent change to High in the external clock signal to High.

According to another aspect of the present invention, there is provided a semiconductor storage device for performing data read/write operation in normal operation mode and stopping the data read/write operation in stand-by mode, including a memory cell array for storing data; an internal clock signal output circuit for outputting an internal clock signal based on an external clock signal input from outside; a refresh operation unit for refreshing the memory cell array in accordance with the internal clock signal; and a refresh request signal output circuit for outputting a refresh request signal to request refresh of the memory cell array, wherein the internal clock signal output circuit stops output of the internal clock signal on condition that output of the refresh request signal is stopped in the stand-by mode. Since the internal clock signal output circuit does not output the internal clock signal when the output of the refresh request signal is stopped in the stand-by mode, it is possible to reduce current consumption in the stand-by mode.

In the above semiconductor storage device, the refresh request signal output circuit may output the refresh request signal at a constant period. The above semiconductor storage device may further include a logic circuit for outputting a logical operation result between a binary signal indicating the normal operation mode or the stand-by mode and the refresh request signal, wherein the internal clock signal output circuit controls output of the internal clock signal in accordance with the logical operation result. The memory cell array may perform data writing or reading in accordance with the internal clock signal.

Preferably in the above semiconductor storage device, the internal clock signal output circuit prevents hazard from occurring in the internal clock signal. This allows enhancing higher speed operation. The internal clock signal output circuit may change the internal clock signal from a first logic level to a second logic level, following a change in the external clock signal at a start of output of the internal clock signal, whereas keeping stopping the internal clock signal upon output of the refresh request signal in a timing when the external clock signal is at the second logic level. Further, the internal clock signal output circuit may start outputting the internal clock signal in response to a change in the external clock signal to the second logic level.

In the above semiconductor storage device, the internal clock signal output circuit may change the internal clock signal from a first logic level to a second logic level, following a change in the external clock signal at a start of output of the internal clock signal, and the refresh operation unit may refresh the memory cell array in accordance with the internal clock signal and the refresh request signal; further, the semiconductor storage device may comprises a circuit for blocking input of the refresh request signal to the refresh operation unit upon output of the refresh request signal in a timing when an output of the internal clock signal output circuit is at the second logic level. The above semiconductor storage device may further include D flip-flop connected between the internal clock signal output circuit and the refresh operation unit, having a D terminal receiving the refresh request signal and Q output input as the refresh request signal to the refresh operation unit in the stand-by mode.

According to another aspect of the present invention, there is provided a semiconductor storage device including a memory cell array including at least one memory cell requiring a refresh; an external clock terminal for receiving an external clock; and a buffer coupled to the external clock terminal to receive the external clock, the buffer outputting an internal clock having a first level and a second level different from the first level in response to the change of the external clock during a first mode, and the buffer outputting a single one of the first and second levels while changing the external clock during a second mode, thereby the refresh being conducted by the first and second levels of the internal clock. Performing different internal clock controls in the first and second modes allows appropriate control of the refresh in each mode.

The above semiconductor storage device may further include a timer for generating a refresh request signal; a second external terminal for receiving a chip select signal; and a control gate for generating an internal clock enable signal in response to the refresh request signal and the chip select signal, the internal clock enable signal having a first logic level corresponding to the first mode and a second logic level corresponding to the second mode.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
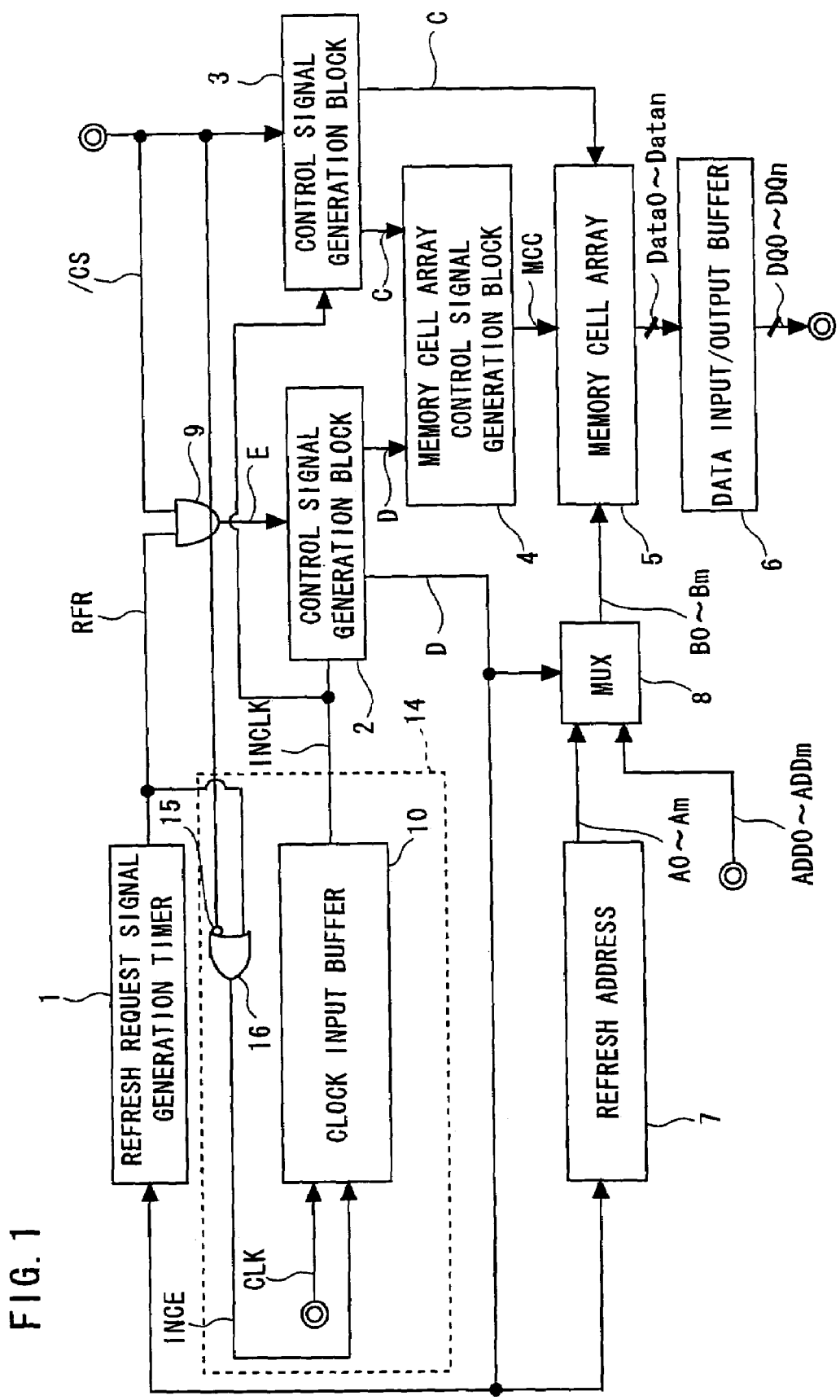
FIG. 1 is a block diagram showing a semiconductor storage device according to the first embodiment of the present invention.
Figure 2:
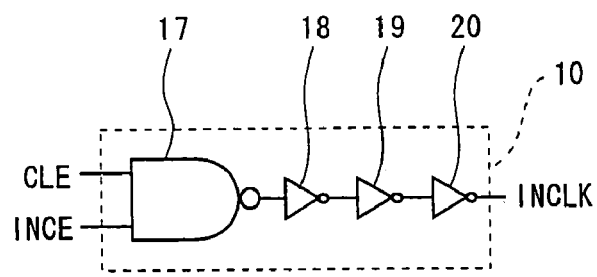
FIG. 2 is a circuit diagram showing a clock input buffer shown in FIG. 1.
Figure 3:
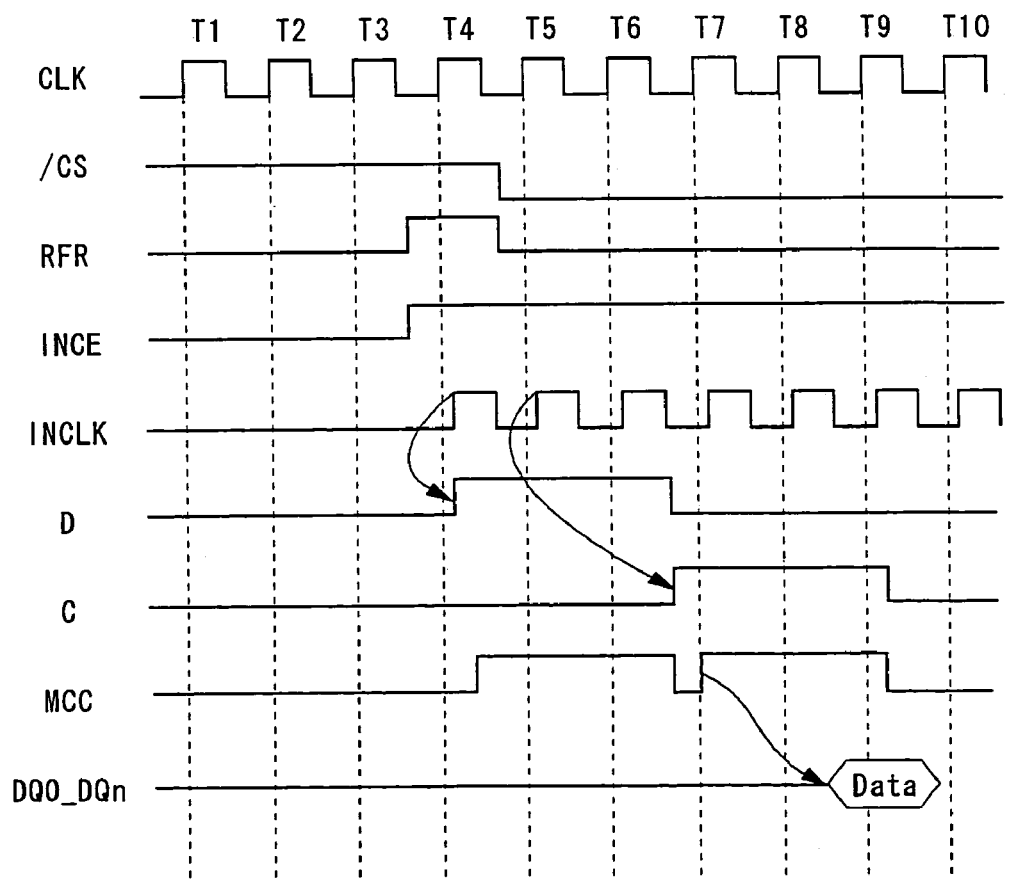
FIG. 3 is a timing chart for a refresh operation and a successive read operation in the semiconductor storage device according to the embodiment of the present invention.
Figure 4:
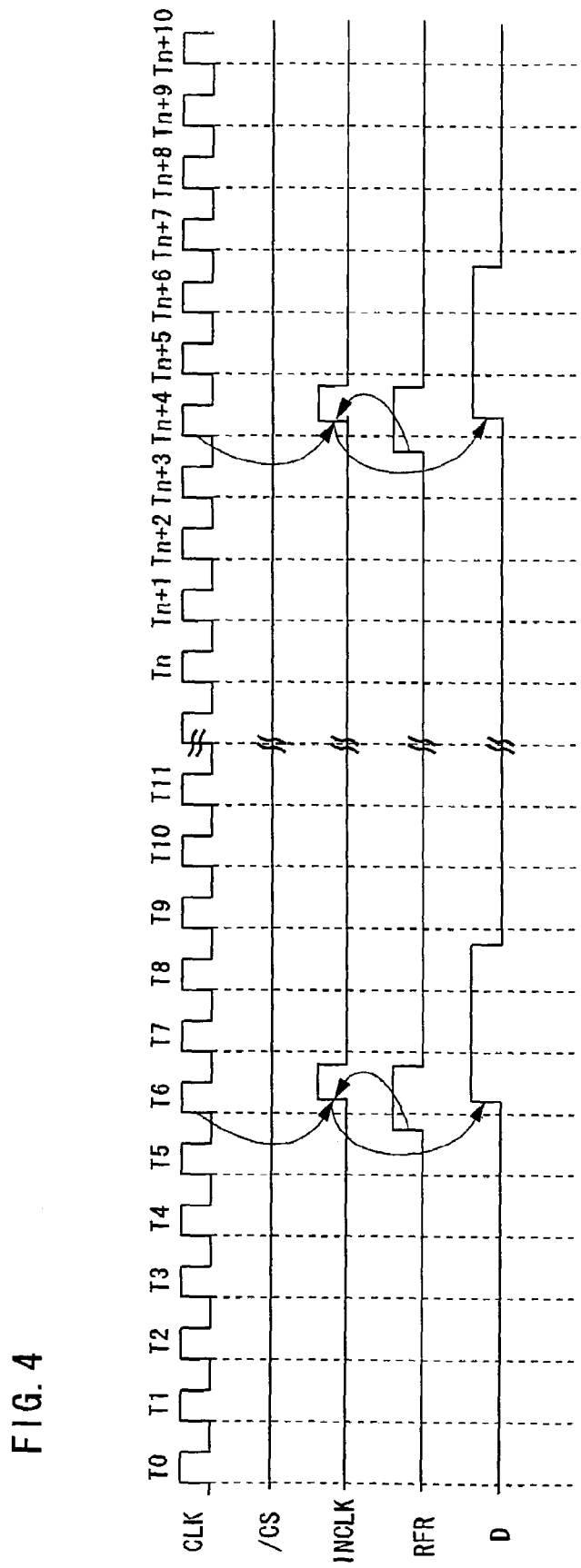
FIG. 4 is a timing chart for the operation between successive refresh operations in the semiconductor storage device according to the embodiment of the present invention.
Figure 15:
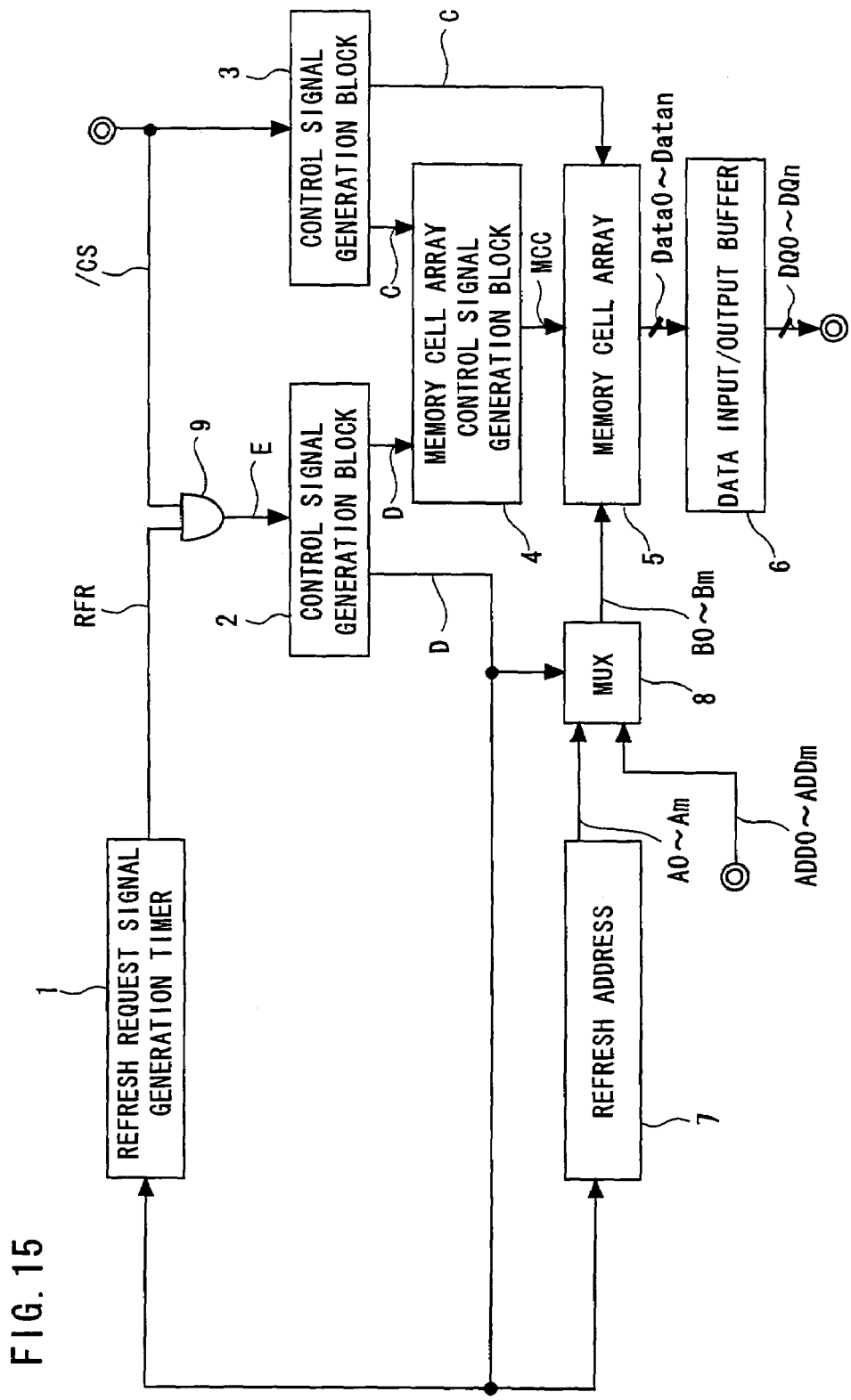
FIG. 15 is a block diagram showing a conventional semiconductor storage device.
Figure 16A:
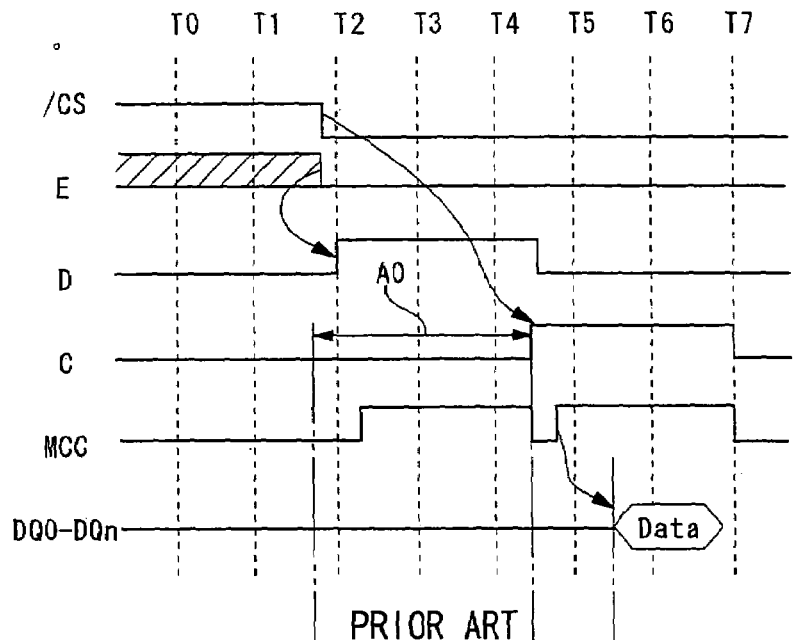
FIG. 16A is a timing chart showing the operation of the conventional semiconductor storage device shown in FIG. 15.
Figure 16B:
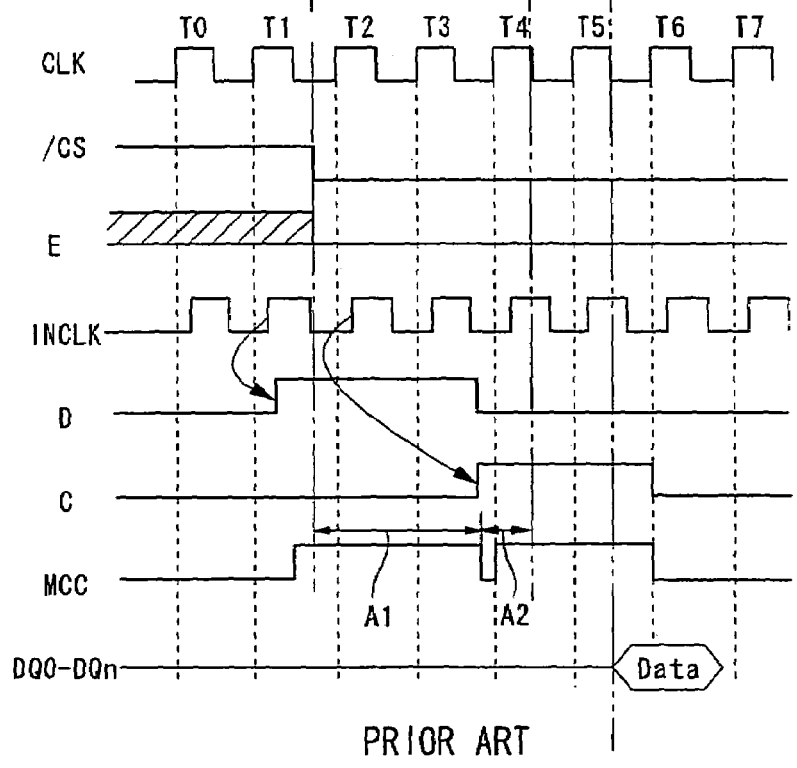
FIG. 16B is a timing chart showing the operation of another conventional semiconductor storage device shown in FIG. 17.

Preferred embodiments of the present invention are explained hereinafter in detail with reference to the accompanying drawings. Firstly, the first embodiment of the present invention is explained below. FIG. 1 is a block diagram showing a semiconductor storage device according to this embodiment. FIG. 2 is a circuit diagram showing a clock input buffer 10 shown in FIG. 1. FIG. 3 is a timing chart when performing a read operation after a refresh operation in the semiconductor storage device according to this embodiment. FIG. 4 is a timing chart showing the operation between successive refresh operations in the semiconductor storage device according to this embodiment. In FIG. 1, the same elements as in FIGS. 15 and 17 are denoted by the same reference symbols and redundant description is omitted.

Figure 17:
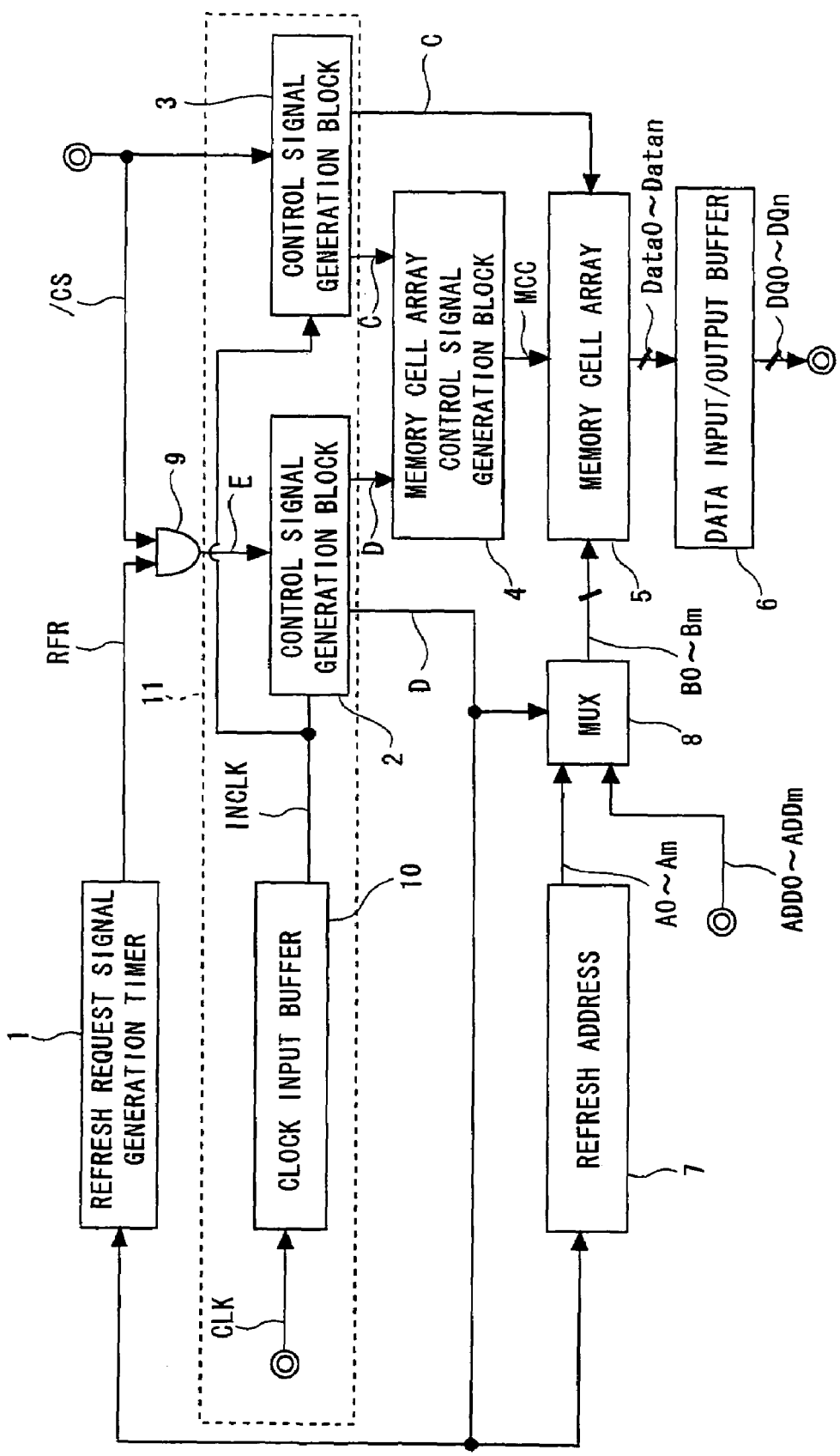
FIG. 17 is a block diagram showing a conventional synchronized semiconductor storage device.
Figure 18:
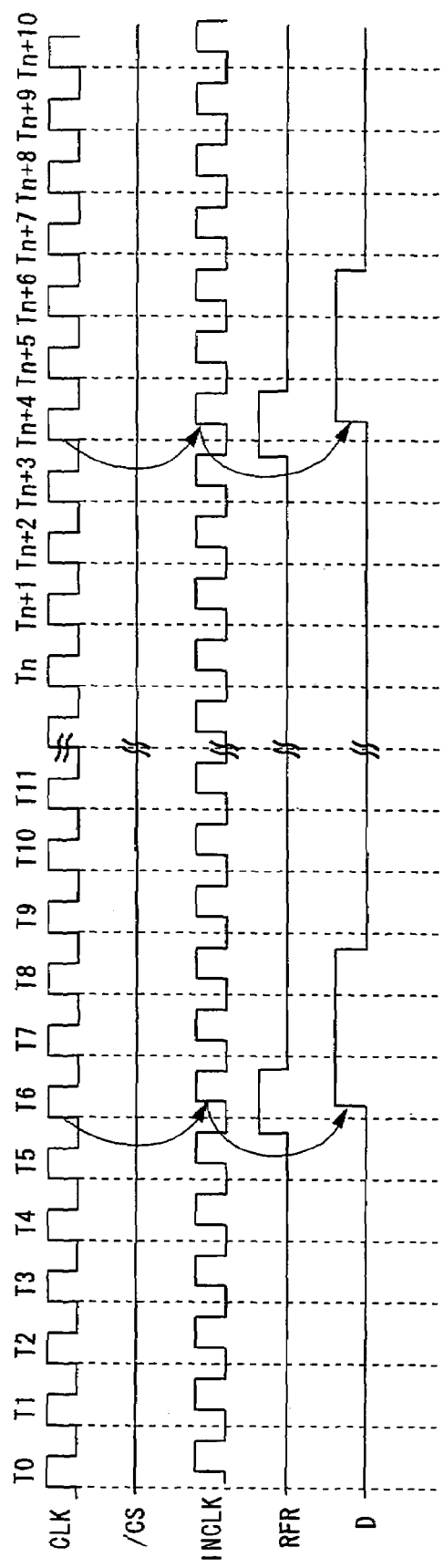
FIG. 18 is a timing chart showing the operation waveform of the semiconductor storage device shown in FIG. 17 in stand-by mode when an external signal /CS is High.

The semiconductor storage device of FIG. 1 is different from the conventional synchronized semiconductor storage device of FIG. 17 in the part enclosed by a frame 14. This semiconductor storage device has a NOT circuit 15 to receive an external signal /CS, and an OR circuit 16 to receive the output of the NOT circuit 15 and a refresh request signal REF and output their logical sum as an internal clock enable signal INCE to the clock input buffer 10. The refresh request signal RFR is generated in a constant period regardless of an external state.

Referring then to FIG. 2, the clock input buffer 10 has a NAND circuit 17 to receive a clock signal CLK and the internal clock enable signal INCE and output an inversion of their logical product. At the output end of the NAND circuit 17, three inverters 18 to 20 are connected in series. The output of the last stage inverter 20 is input as an internal clock signal INCLK to the control signal generation blocks 2 and 3. Except for these, the semiconductor storage device of this embodiment has the same structure as the conventional semiconductor storage device shown in FIG. 17.

Now, the operation of the semiconductor storage device of this embodiment having the above structure is explained below. The explanation is given on the case where a read operation is performed successively after a refresh operation. As shown in FIG. 3, the semiconductor storage device receives a clock signal CLK from outside at a constant period. The frequency of the clock signal CLK is 100 MHz and the period is 10 ns, for example.

In the initial state, the external signal is High and the device is in stand-by mode. The output of the NOT circuit 15 is thus Low. The refresh request signal RFR is not generated since the supply of RFR is stopped, and the refresh request signal RFR is thus Low. Thus, the two signals input to the OR circuit 16 are both Low, and the output of the OR circuit 16, which is the internal clock enable signal INCE, is Low. Here, the output of the NAND circuit 17 in the clock input buffer 10 is kept Low regardless of the clock signal CLK, and the clock input buffer 10 does not output the internal clock signal INCLK. The clock input buffer 10 stops the generation/output of the internal clock signal INCLK.

In this state, High level of refresh request signal RFR is generated. The output of the OR circuit 16, which is the internal clock enable signal INCE, is thereby becomes High. As a result, the NAND circuit 17 outputs an inverted clock signal CLK, and the clock input buffer 10 thus outputs the internal clock signal INCLK following the external clock signal CLK to the control signal generation blocks 2 and 3. The control signal generation block 2 as a refresh operation unit thereby outputs a refresh control signal D in synchronization with the internal clock signal INCLK, starting the refresh operation.

After that, the external signal /CS becomes Low during the refresh operation. Since the NOT circuit 15 becomes High, the internal clock enable signal INCE output from the OR circuit 16 is kept High even after the refresh operation ends and the refresh request signal RFR becomes Low; thus, the clock input buffer 10 keeps outputting the internal clock signal INCLK. Then, after the refresh operation ends and the refresh request signal RFR becomes Low, the control signal generation block 3 outputs High level of read operation signal C, starting the read operation. As a result, data is read out from the memory cell array 5 and output as external signals DQ0 to DQn through the data input/output buffer 6.

This is the same when performing the write operation instead of the read operation. The semiconductor storage device of this embodiment operates in the same way as the conventional semiconductor storage device of FIG. 17 except for the above.

As shown in FIG. 4, the semiconductor storage device of this embodiment synchronizes the refresh control signal with the internal clock signal INCLK, thereby achieving high-speed read operation. Further, the NOT circuit 15 and the OR circuit 16 stop the generation of the internal clock signal INCLK to consume no current during the period where the external signal /CS is High and the refresh request signal RFR is Low, that is, in the stand-by mode where the refresh request signal RFR is not generated and the semiconductor storage device is not operating, thereby suppressing the current consumption in the stand-by mode.

Figure 5:
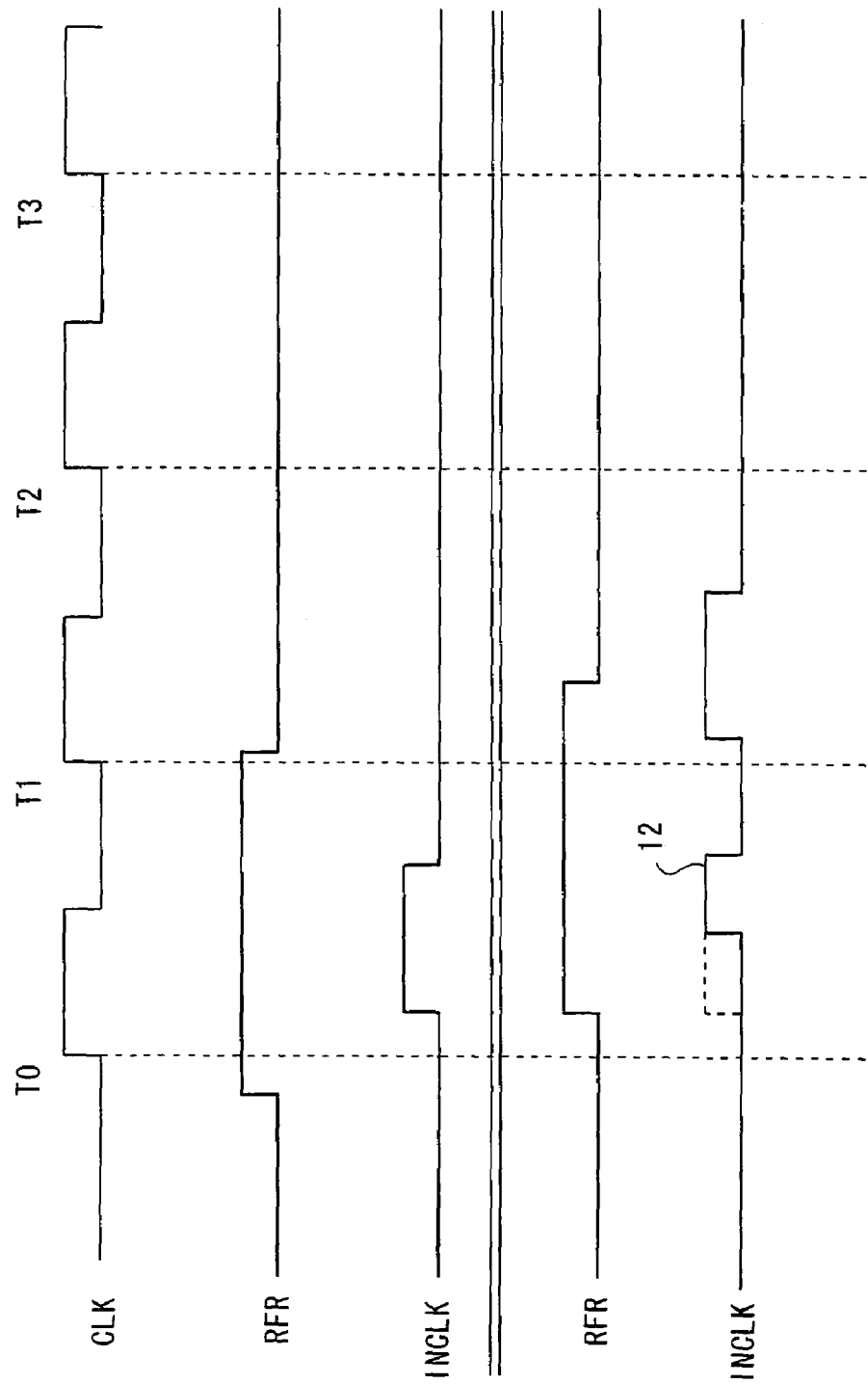
FIG. 5 is a timing chart to explain a problem in the embodiment of the present invention.
Figure 6A:
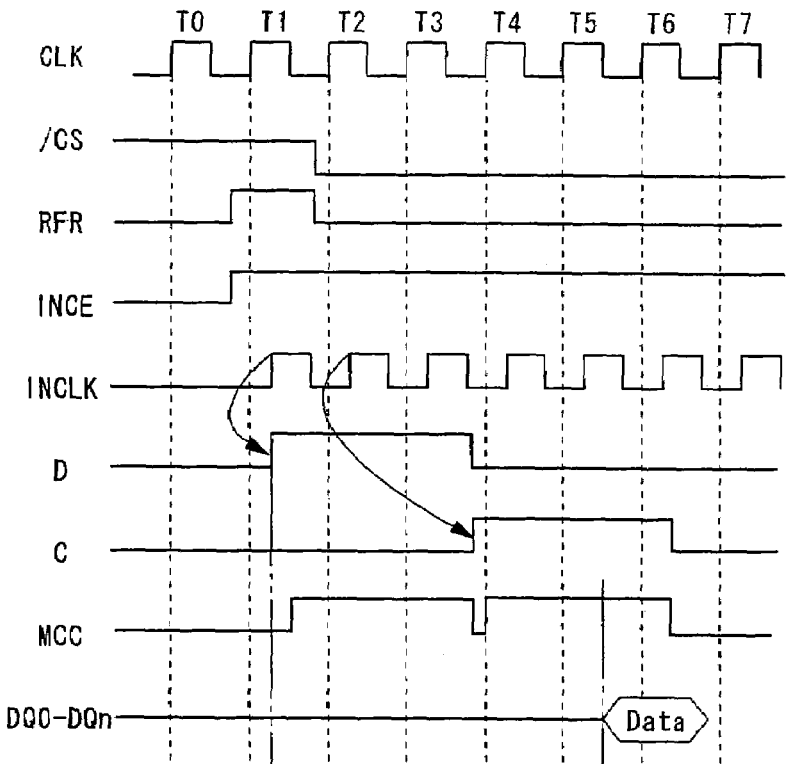
FIGS. 6A and 6B are timing charts to explain a problem in the embodiment of the present invention.
Figure 6B:
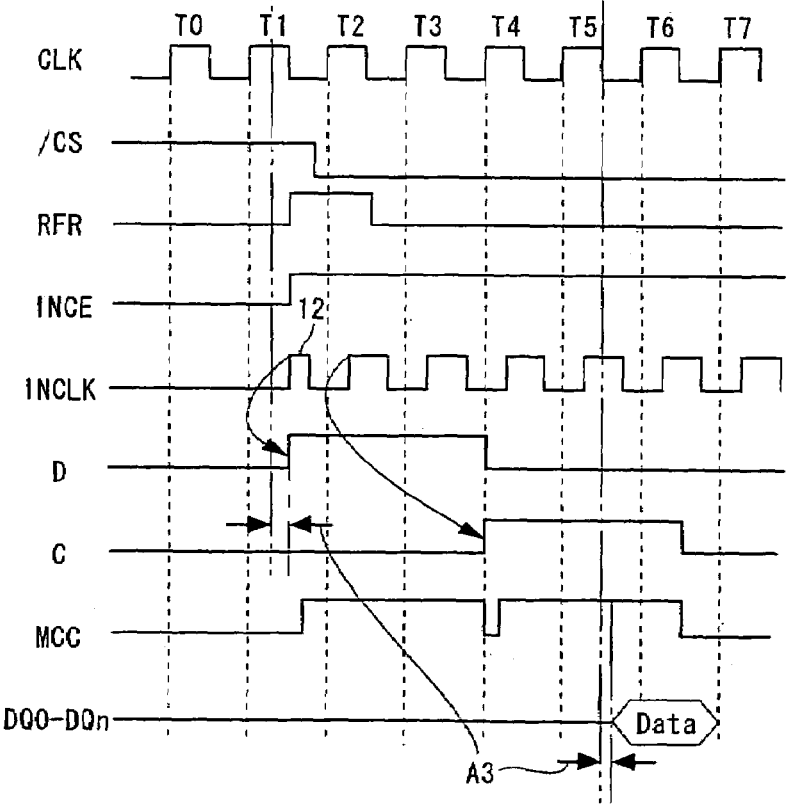
Figure 7:
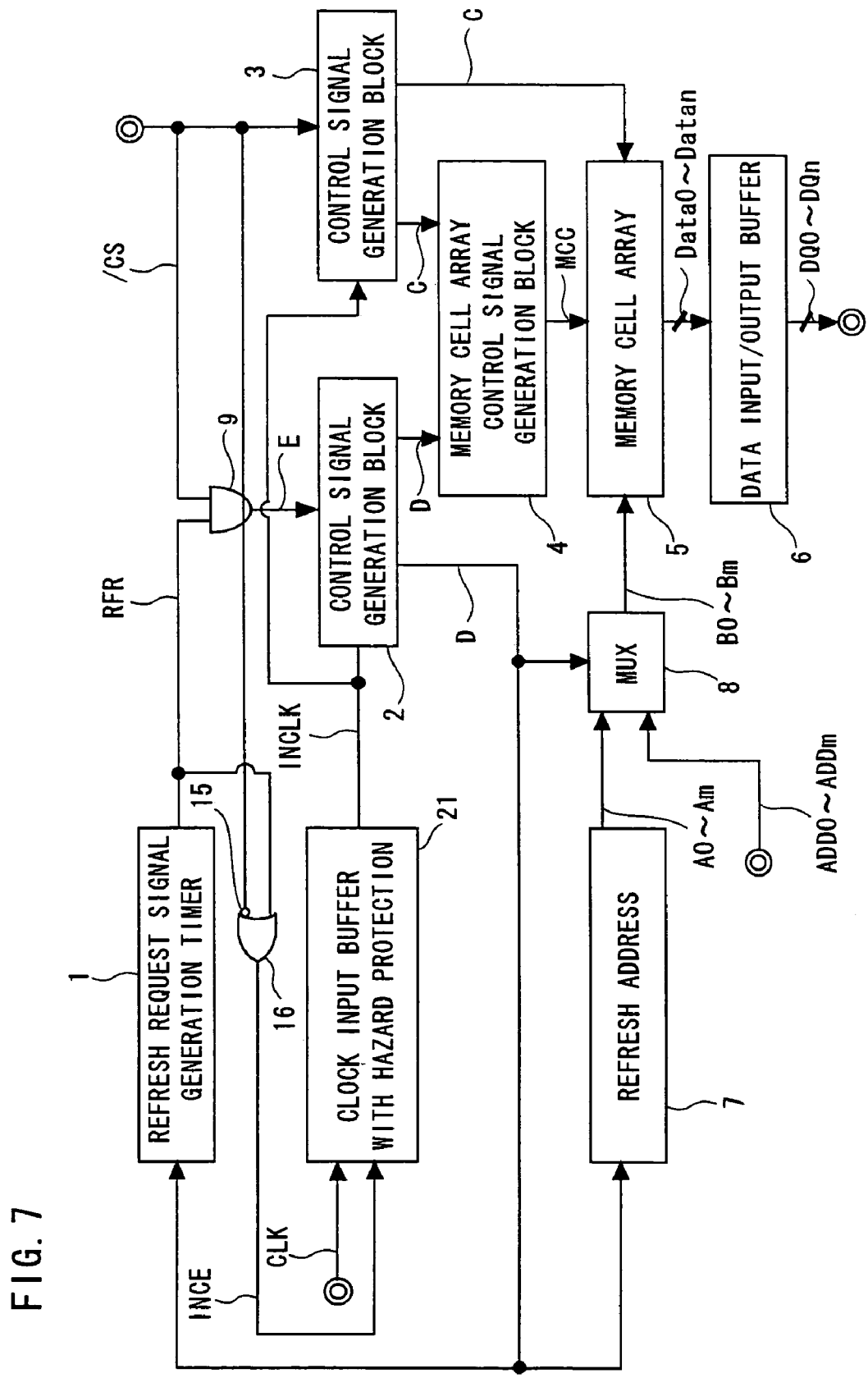
FIG. 7 is a block diagram showing a semiconductor storage device according to the second embodiment of the present invention.
Figure 8:
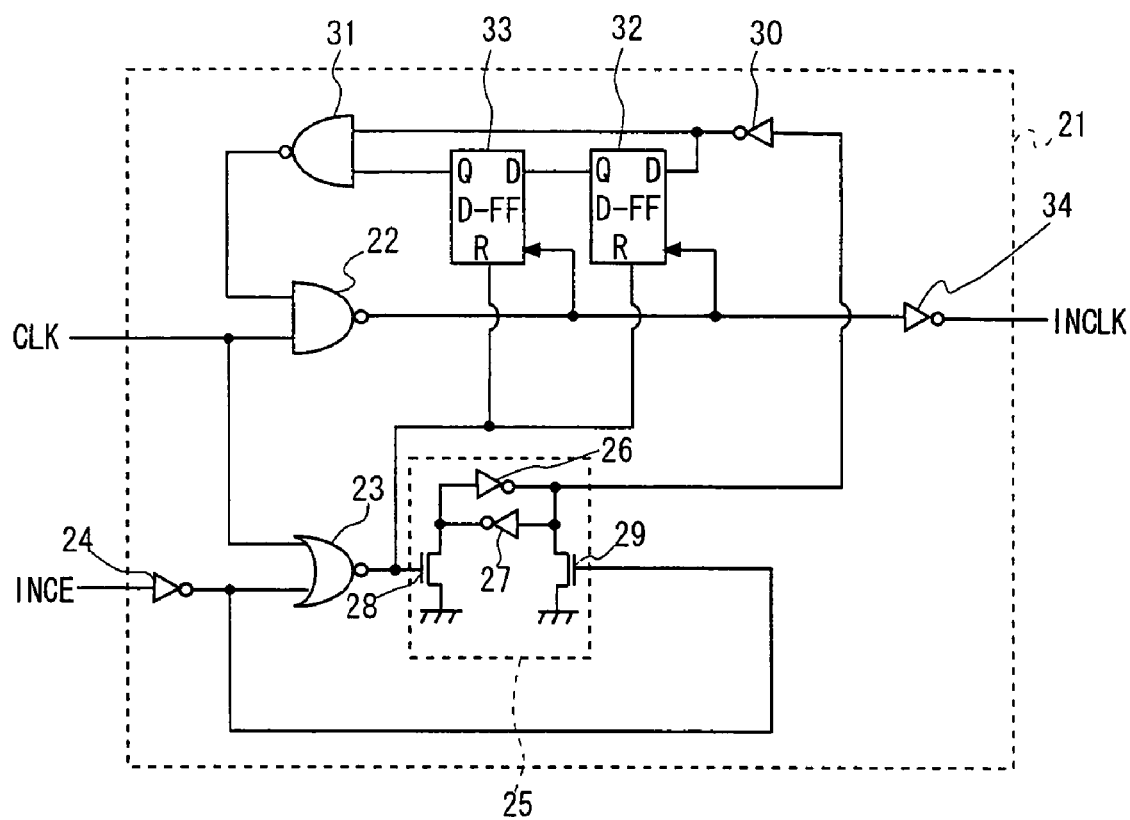
FIG. 8 is a circuit diagram showing a clock input buffer with hazard protection shown in FIG. 7.
Figure 9:
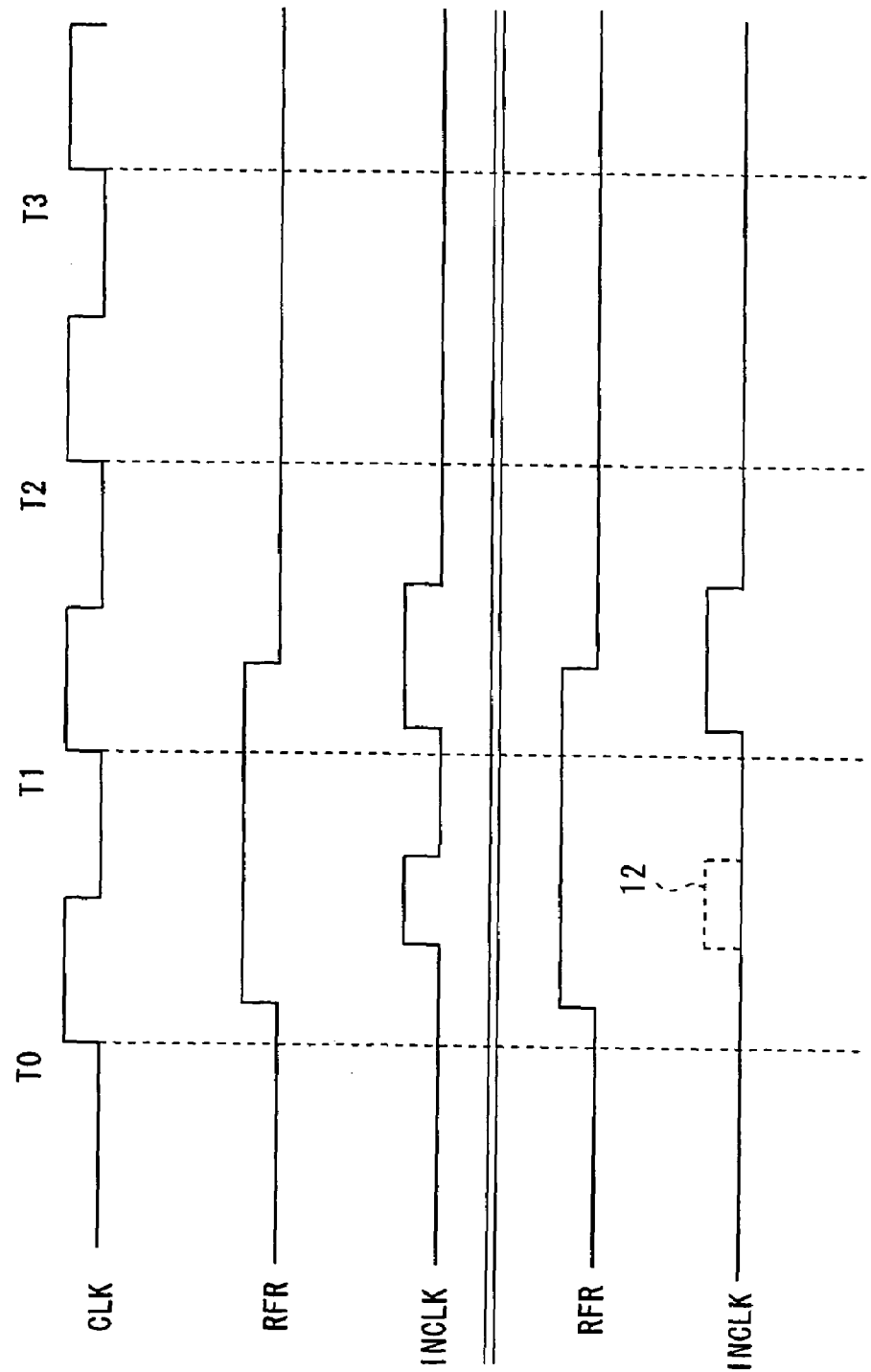
FIG. 9 is a timing chart showing the relationship between a refresh request signal and an internal clock signal in the embodiment of the present invention.
Figure 10A:
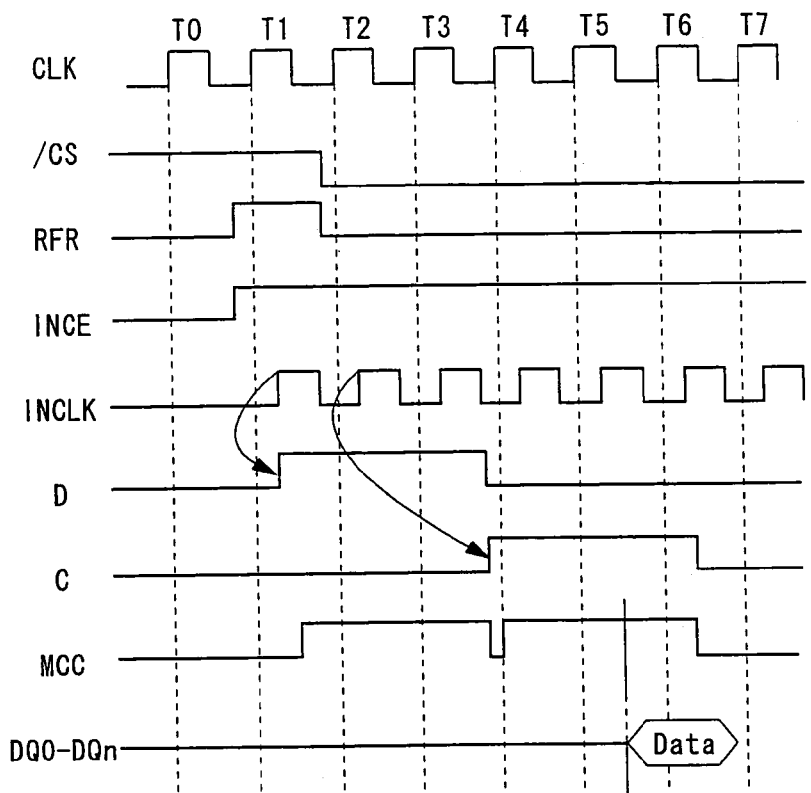
FIGS. 10A and 10B are timing charts for a refresh operation and a successive read operation in the semiconductor storage device according to the embodiment of the present invention.
Figure 10B:
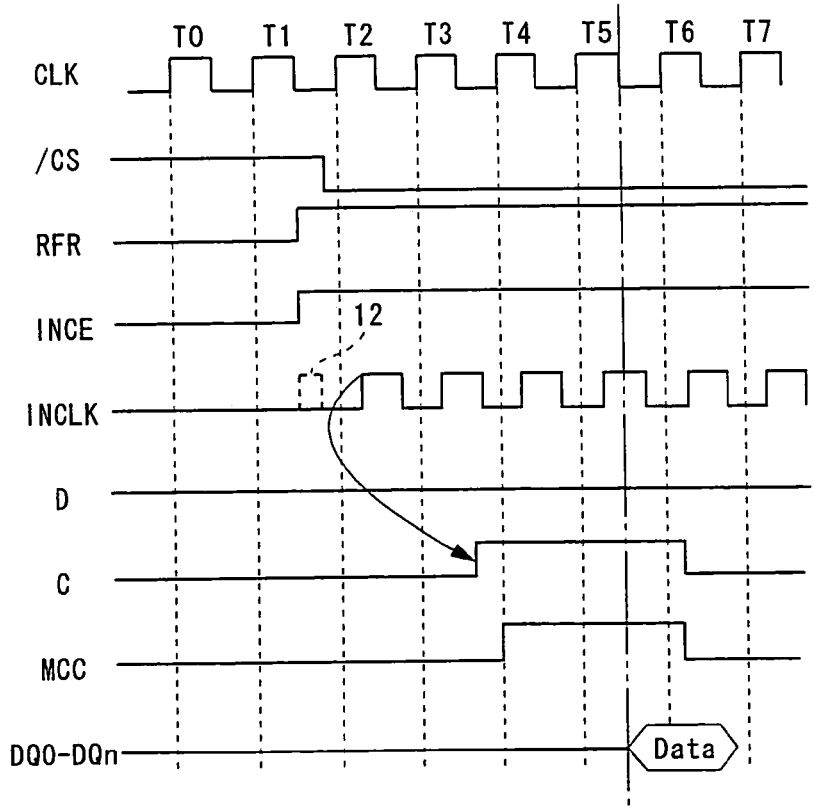

Now, the second embodiment of the present invention is explained hereinafter. FIGS. 5, 6A, 6B are timing charts to explain a problem in the first embodiment of this invention. FIG. 7 is a block diagram showing a semiconductor storage device according to the second embodiment of this invention. FIG. 8 is a circuit diagram showing a clock input buffer with hazard protection shown in FIG. 7. FIG. 9 is a timing chart showing the relationship between a refresh request signal and an internal clock signal in the semiconductor storage device of this embodiment. FIGS. 10A and 10B are timing charts for the semiconductor storage device of this embodiment performing a read operation after a refresh operation, when the refresh request signal is generated in such timing to cause no hazard, and when it is generated in such timing not to cause hazard, respectively.

First, a problem in the first embodiment of the invention described earlier is explained. As shown in FIG. 5, in the first embodiment, hazard 12 can occur in the internal clock signal INCLK depending on the generation timing of the refresh request signal RFR. If, as shown in the upper part of FIG. 5, the refresh request signal RFR rises before the clock signal CLK rises, the internal clock signal INCLK rises reflecting the rise of the clock signal CLK, and it falls reflecting the next fall of the clock signal CLK, thus causing no hazard. If, on the other hand, as shown in the lower part of FIG. 5, the refresh request signal RFR rises after the clock signal CLK rises, the internal clock signal INCLK rises later than the timing reflecting the rise of the clock signal CLK. Since the internal clock INCLK still falls reflecting the fall of the clock signal CLK, the hazard 12 occurs in the internal clock signal INCLK.

FIG. 6A shows the operation of the semiconductor storage device according to the first embodiment when the hazard is not occurring in the internal clock signal, and FIG. 6B shows that when the hazard is occurring. As shown in FIG. 6B, if the hazard 12 occurs in the internal clock signal, the internal clock signal INCLK is generated when the refresh request signal RFR is generated immediately before the external signal /CS changes from High to Low, and the refresh control signal is thus generated in synchronization therewith, starting the refresh operation. The start of the read operation thus delays for the time shown by A3, compared with the case where the refresh request signal is generated in the timing not to cause the hazard in the internal clock signal. This decreases the effect of increasing the operation speed by synchronization.

To overcome this problem, the second embodiment replaces the clock input buffer 10 in the semiconductor storage device of the first embodiment with a clock input buffer 21 with hazard protection, as shown in FIG. 7. The structure of the semiconductor storage device of this embodiment is the same as that of the first embodiment except for the above.

As shown in FIG. 8, the clock input buffer 21 with hazard protection has a NAND circuit 22 and a NOR circuit 23 for receiving a clock signal CLK, and an inverter 24 for receiving an internal clock enable signal INCE. The output of the inverter 24 is input to the NOR circuit 23.

The clock input buffer 21 with hazard protection further has a Reset-Set flip-flop (R-S-FF) 25. The flip-flop 25 includes two inverters 26 and 27 connected in loop and two N-transistors 28 and 29 connected in parallel. The input end of the inverter 26 and the output end of the inverter 27 are connected to the drain of the N-transistor 28. The gate of the N-transistor 28 serves as the set terminal of the flip-flop 25, and the source of the N-transistor 28 is grounded. The output end of the inverter 26 and the input end of the inverter 27 are connected to the drain of the N-transistor 29. The gate of the N-transistor 29 serves as the reset terminal of the flip-flop 25, and the source of the N-transistor 29 is grounded. Further, the output end of the inverter 26 serves as the Q terminal of the flip-flop 25.

The output of the NOR circuit 23 is connected to the set terminal of the flip-flop 25, which is the gate of the N-transistor 28. The output of the inverter 24 is connected to the reset terminal of the flip-flop 25, which is the gate of the N-transistor 29.

The clock input buffer 21 with hazard protection also has an inverter 30 for receiving the output of the inverter 26, and a NAND circuit 31 for receiving the output of the inverter 30. The output of the NAND circuit 31 is input to the NAND circuit 22.

Further, the clock input buffer 21 with hazard protection has two Reset D flip-flops (D-FF) 32 and 33. The clock terminals of the flip-flops 32 and 33 receive the output of the NAND circuit 22, and the reset terminals receive the output of the NOR circuit 23. The D terminal of the flip-flop 32 receives the output of the inverter 30, and the Q output of the flip-flop 32 is connected to the D terminal of the flip-flop 33. The Q output of the flip-flop 33 is input to the NAND circuit 31.

Furthermore, the clock input buffer 21 with hazard protection has an inverter 34 for receiving the output of the NAND circuit 22. The output of the inverter 34 is output as an internal clock signal INCLK from the clock input buffer 21 with hazard protection.

Now, the operation of the semiconductor storage device according to the second embodiment having the above structure is explained below. Referring to FIGS. 7 and 8, the Q output of the D flip-flop 33 is High in the initial state. In this state, a clock signal CLK from outside and an internal clock enable signal INCE from the OR circuit 16 are input to the clock input buffer 21 with hazard protection.

The operation when the internal clock enable signal INCE is High is as follows. Since High level of internal clock enable signal INCE is input, the output of the inverter 24 is Low. If the clock signal CLK is Low, the output of the NOR circuit 23 is High to set the Reset-Set flip-flop 25. The N transistor 28 thereby turns on, and the input of the inverter 26 is Low and the output of the inverter 26 is High. Thus, the output of the inerter 30 is Low, and the output of the NAND circuit 31 is High. The output of the NAND circuit 22 is thereby High, and the internal clock signal INCLK is Low.

Even if the clock signal CLK becomes High in this state, the Q output of the flip-flop 25 or the output end of the inverter 26 stays High, and the output of the NAND circuit 31 thus stays High. Hence, when the clock signal CLK becomes High, the output of the NAND circuit 22 becomes Low, and the internal clock signal INCLK becomes High. In this way, in the case where the internal clock enable signal INCE is High, the internal clock signal INCLK operates in accordance with the clock signal CLK. If, in this state, the clock signal CLK falls twice, the Q output of the flip-flop 33 becomes Low, but the output of the NAND circuit 31 stays High, and the internal clock signal INCLK keeps operating.

On the other hand, the operation when the internal clock enable signal INCE is Low is as follows. Since Low level of internal clock enable signal INCE is input, the output of the inverter 24 is High. The N-transistor 29 thereby turns on and the flip-flop 25 is reset to fix the Q output of the flip-flop 25 to Low, and the output of the inverter 30 becomes High. When, in this state, the clock signal CLK falls once, the output of the NAND circuit 22 rises once, and the Q output of the flip-flop 32 changes from Low to High. The Q output of the flip-flop 33 stays Low. Then, when the clock signal CLK falls one again, the Q output of the flip-flop 33 changes form Low to High. The output of the NAND circuit 31 thereby becomes Low to fix the internal clock signal INCLK to Low. In this way, if the internal clock enable signal INCE changes from High to Low, the internal clock signal INCLK is fixed to Low and stopped after it is output for two periods.

Further, the operation when the internal clock enable signal INCE changes from Low to High when the clock signal CLK is High is as follows. Even if the internal clock enable signal INCE becomes High when the clock signal CLK is High, the output of the NOR circuit 23 still stays Low. Thus, the Q output of the flip-flop 25 also stays fixed to Low and the internal clock signal INCLK stays stopped. On the other hand, if the internal clock enable signal INCE becomes High when the clock signal CLK is Low, the output of the NOR circuit 23 becomes High, and the internal clock signal INCLK becomes High by the above operation in the next time the clock signal CLK becomes High.

Thus, as shown in FIGS. 9, 10A, and 10B, even if the refresh request signal RFR changes from Low to High and the internal clock enable signal INCE changes from Low to High when the clock signal CLK is High, the internal clock signal INCLK does not become High but the stop state is maintained. Then, in the next time the clock signal CLK becomes High, the internal clock signal INCLK becomes High for the first time in accordance with the clock signal CLK. After that, the internal clock signal INCLK operates in conjunction with the clock signal CLK. It is thereby possible to prevent hazard from occurring in the internal clock signal INCLK. In FIGS. 9 and 10B, the peak shown by a dotted line in the internal clock signal INCLK indicates the hazard 12 that does not really occur. The operation of this embodiment is the same as the first embodiment except for the above.

As described in the foregoing, this embodiment allows preventing the hazard from occurring in the internal clock INCLK. If the refresh request signal RFR becomes High immediately before the external signal /CS changes from High to Low, the refresh control signal is not generated so as to postpone the refresh operation. This prevents a delay in the read operation and enables the higher-speed read operation than in the first embodiment. In the case where the refresh operation is not started, the refresh request signal does not become Low but stays High until the next time the refresh operation is performed. The other effects of this embodiment are the same as those of the first embodiment.

Figure 11:
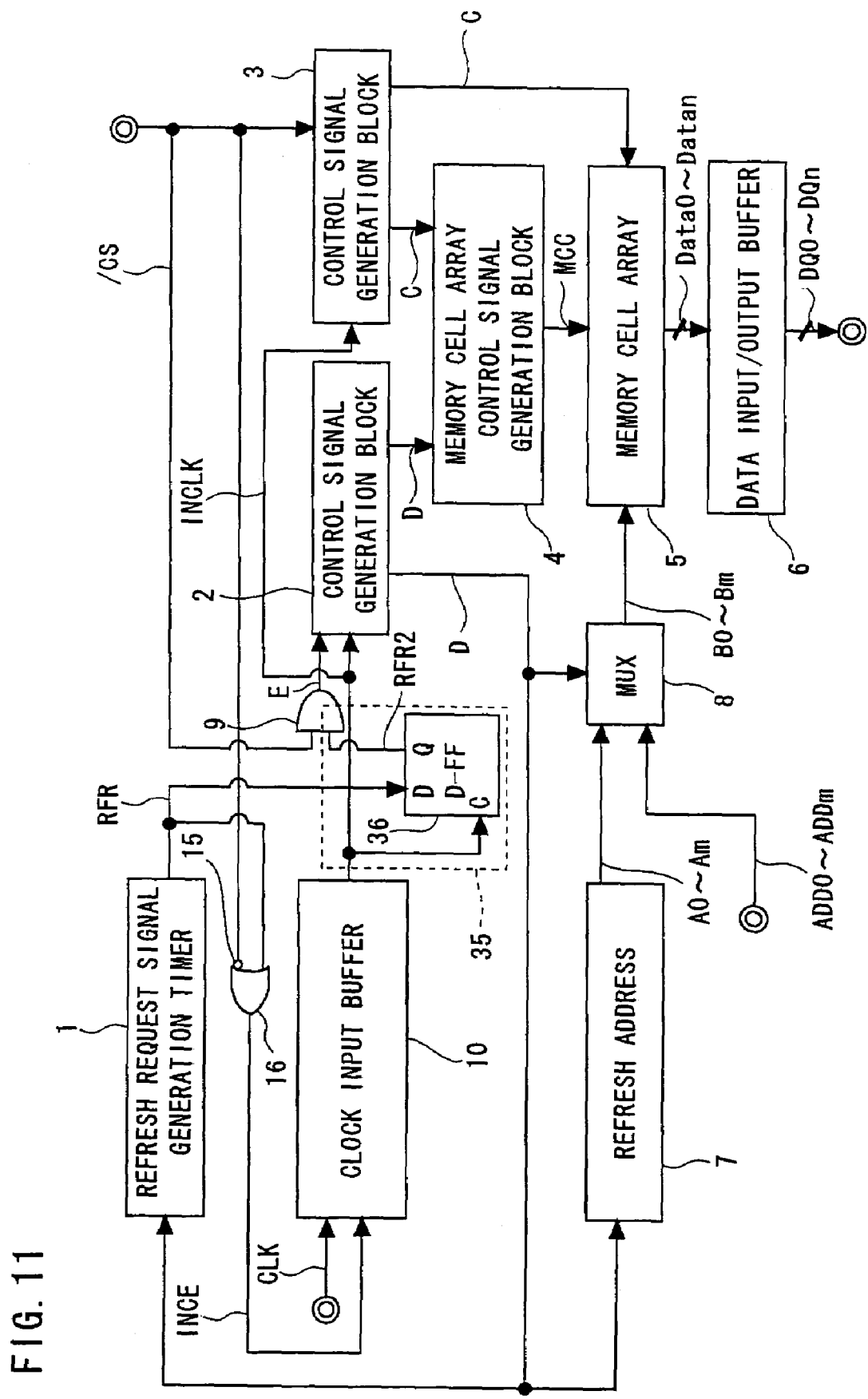
FIG. 11 is a block diagram showing a semiconductor storage device according to the third embodiment of the present invention.

Then, the third embodiment of the present invention is explained hereinafter. FIG. 11 is a block diagram showing a semiconductor storage device according to this embodiment.

Figure 12A:
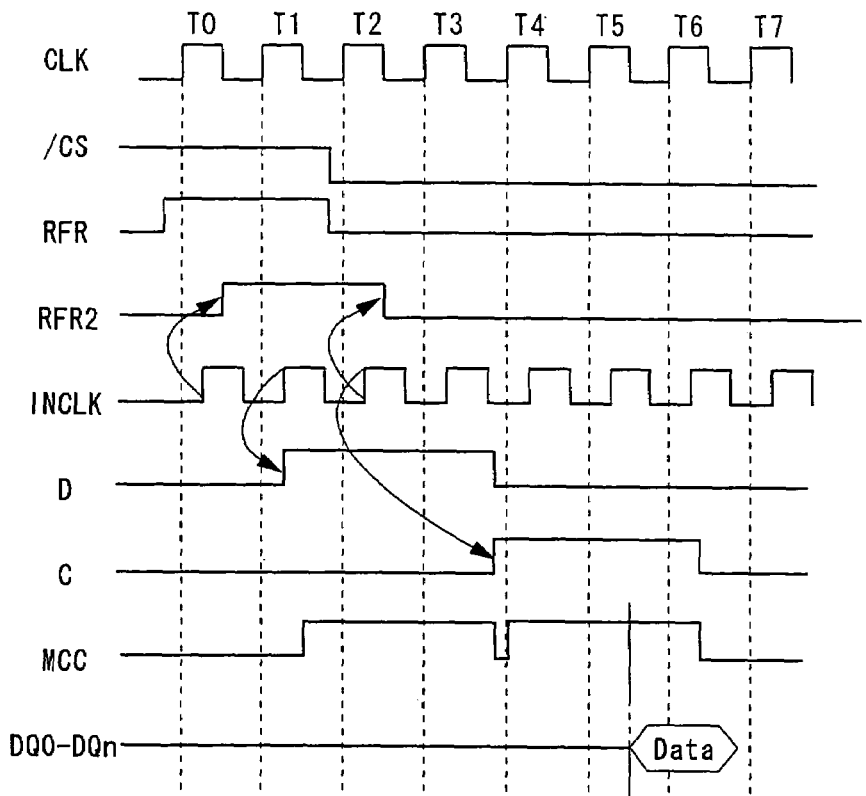
FIGS. 12A and 12B are timing charts showing the operation of the semiconductor storage device according to the embodiment of the present invention.
Figure 12B:
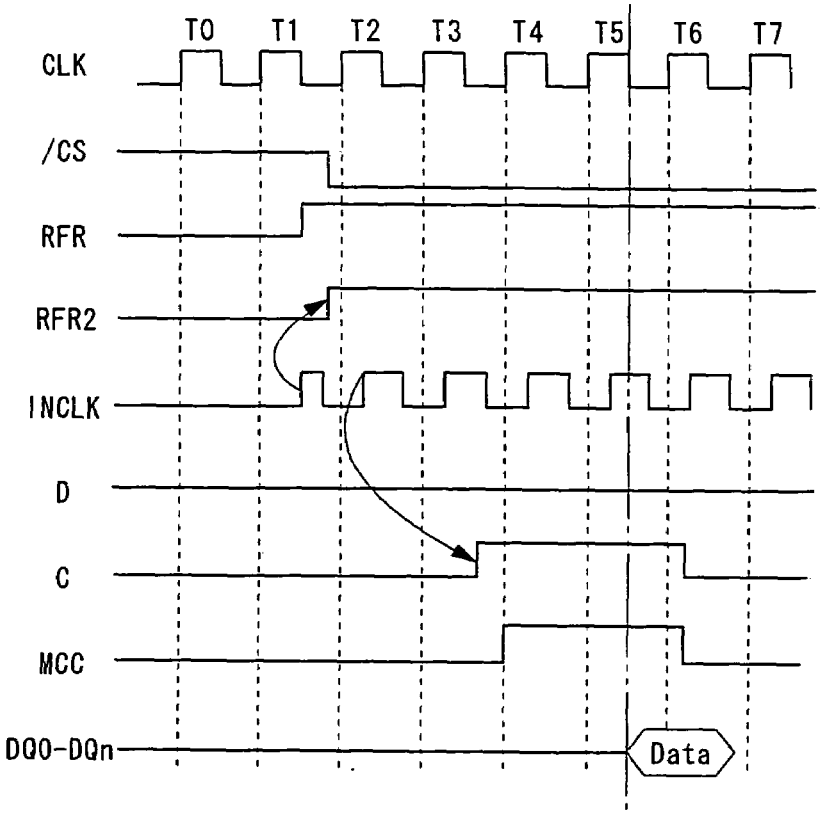

FIGS. 12A and 12B are timing charts showing the operation of the semiconductor storage device. Just like the second embodiment, this embodiment overcomes the problem of the hazard occurring in the internal clock signal in the first embodiment.

The semiconductor storage device of this embodiment is different from that of the first embodiment in the part enclosed by a frame 35 in FIG. 11. This semiconductor storage device has a D flip-flop 36. The clock terminal of the D flip-flop 36 receives the internal clock signal INCLK output from the clock input buffer 10. The D terminal of the D flip-flop 36 receives the refresh request signal RFR output from the refresh request signal generation timer 1. The Q terminal of the D flip-flop 36 outputs a refresh request signal RFR2 to the AND circuit 9. The refresh request signal RFR output from the refresh request generation timer 1 is not input to the AND circuit 9. The structure of this embodiment is the same as that of the first embodiment except for the above.

The operation of the semiconductor storage device of the third embodiment is as below. As shown in FIGS. 11, 12A, and 12B, the refresh request signal RFR output from the refresh request generation timer 1 is input to the D terminal of the D flip-flop 36. In the D flip-flop 36, the refresh request signal RFR is synchronized with the internal clock signal INCLK and output as the refresh request signal RFR2 to the AND circuit 9. Here, if the refresh request signal RFR is input to the D flip-flop 36 when the internal clock signal INCLK is High, the refresh request signal RFR2 is not generated and thus the input of the refresh request signal RFR2 to the control signal generation block 2 is blocked. The refresh request signal RFR2 is generated from the next timing when the internal clock signal INCLK rises, starting the refresh operation. Hence, even when hazard occurs in the internal clock signal, the refresh operation is not started in the timing when the hazard is occurring. Consequently, in no case the refresh operation is started immediately before the external signal /CS changes from High to Low; thus, no delay occurs in the start of the read operation. In the case where the refresh operation is not started, the refresh request signals RFR and RFR2 do not become Low but stay High until the next time the refresh operation is performed. Except for the above, the semiconductor storage device of this embodiment operates in the same way as that of the first embodiment.

As described above, this embodiment allows higher speed read operation than in the first embodiment. The other effects of this embodiment are the same as those of the first embodiment.

Figure 13:
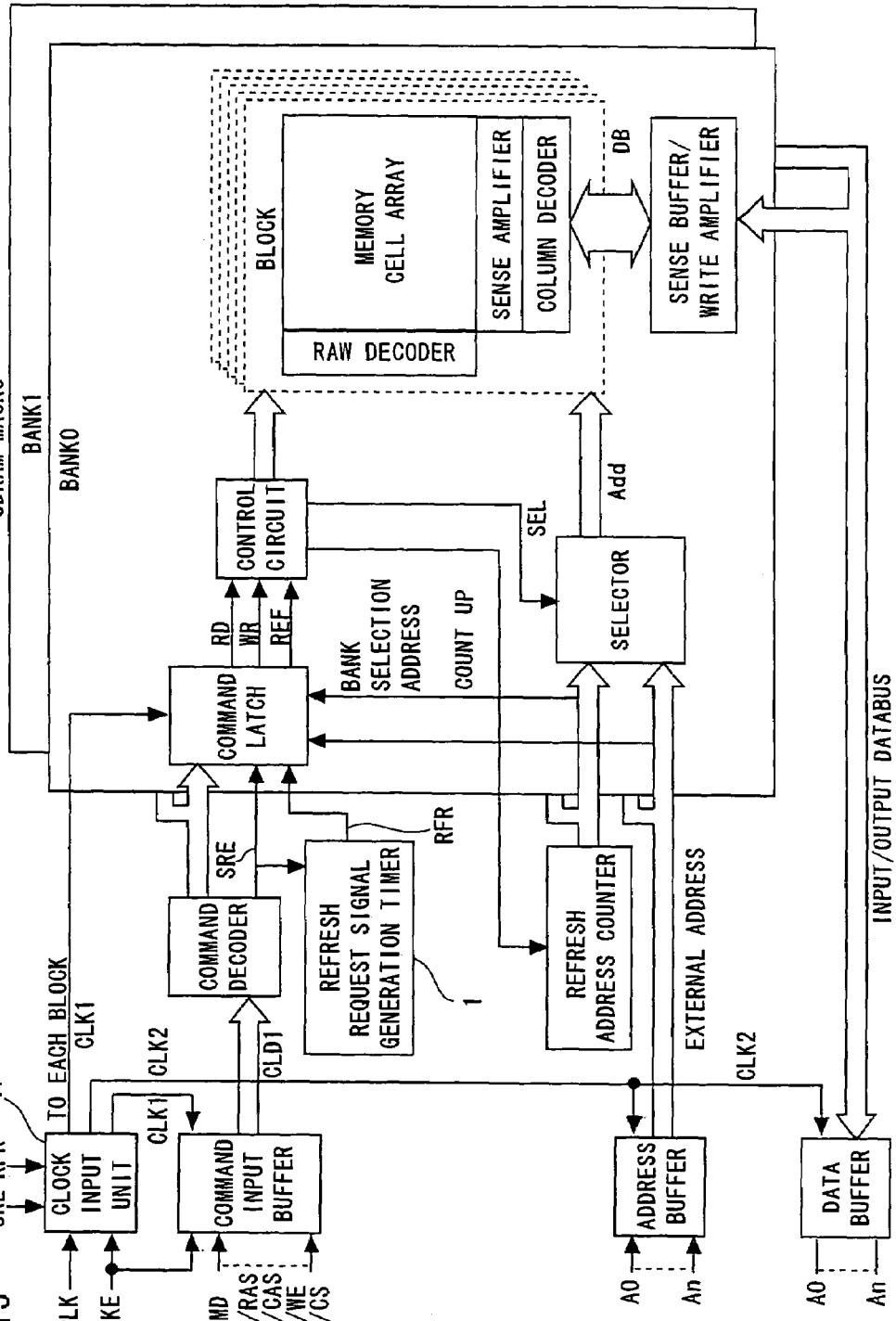
FIG. 13 is a block diagram showing a semiconductor storage device according to the fourth embodiment of the present invention.
Figure 14:
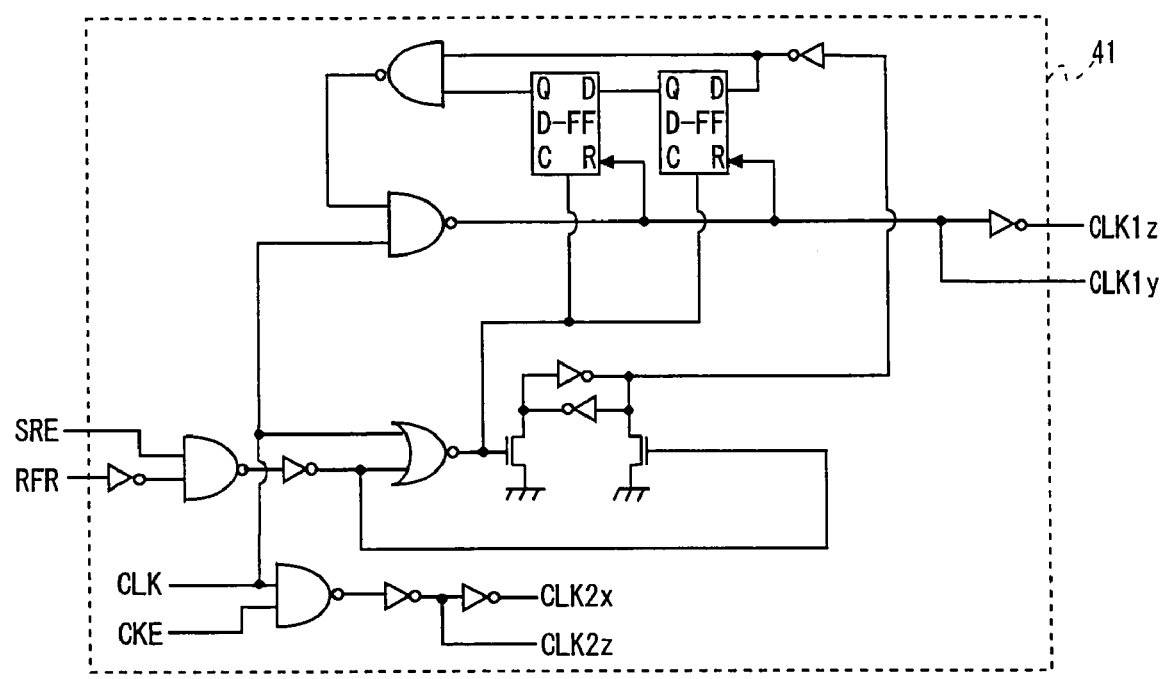
FIG. 14 is a circuit diagram showing a clock input unit shown in FIG. 13.

Finally, the fourth embodiment of the present invention is explained hereinafter. FIG. 13 is a block diagram showing a semiconductor storage device according to this embodiment. FIG. 14 is a circuit diagram showing a clock input unit shown in FIG. 13. As shown in FIGS. 13 and 14, this embodiment applies the present invention to the conventional semiconductor storage device described in Japanese Unexamined Patent Application Publication 2002-184180 explained earlier, providing a self refresh SDRAM. This embodiment replaces the clock input buffer in this conventional semiconductor storage device with a clock input unit 41, and places the refresh request signal generation timer 1 between a command decoder and a command latch. The refresh request signal generation timer 1 is activated by the input of a self refresh entry signal SRE and automatically outputs a refresh request signal RFR at a constant period.

The clock input unit 41 receives the self refresh entry signal SRE and the refresh request signal RFR and outputs clock signals CLK1 and CLK2.

In the semiconductor storage device of this embodiment, the refresh request signal generation timer 1 is activated when the self refresh entry signal SRE becomes High. The command latch controls a signal REF by the refresh request signal RFR. The signal REF is generated in synchronization with the clock signal CLK1.

This structure allows quick generation of signals RD and WR when the mode returns to the normal mode from the self refresh state. Further, since the clock signal CLK1 operates only when the refresh is requested during the self refresh mode, it is possible to reduce power consumption in the stand-by mode.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor storage device for performing data read/write operation in normal operation mode and stopping the data read/write operation in stand-by mode, comprising:
   memory for storing data, refreshed to retain the stored data;
   a clock input buffer for generating an internal clock signal, stopping generation of the internal clock signal in absence of refresh request of the memory in the stand-by mode;
   a memory cell array for storing data;
   a refresh timer for outputting a refresh request signal to request refresh of the memory cell array at a constant period; and
   a refresh operation unit for refreshing the memory cell array in synchronization with the internal clock signal upon input of the refresh request signal in the stand-by mode,
   wherein the clock input buffer generates the internal clock signal based on an external clock signal input from outside.

2. A semiconductor storage device according to claim 1, wherein
   the clock input buffer does not change the internal clock signal to High upon refresh request in a timing when the external clock signal is High, but changes the internal clock signal to High in response to a subsequent change to High in the external clock signal to High.

3. A semiconductor storage device for performing data read/write operation in normal operation mode and stopping the data read/write operation in stand-by mode, comprising:
   memory for storing data, refreshed to retain the stored data; and
   a clock input buffer for generating an internal clock signal, stopping generation of the internal clock signal in absence of refresh request of the memory in the stand-by mode,
   wherein the clock input buffer stops generation of the internal clock signal based on a logical operation result between a binary signal indicating the normal operation mode or the stand-by mode and a binary signal indicating a presence of refresh request.

4. A semiconductor storage device according to claim 3, wherein
the clock input buffer prevents hazard from occurring in the internal clock signal.

5. A semiconductor storage device for performing data read/write operation in normal operation mode and stopping the data read/write operation in stand-by mode, comprising:
a memory cell array for storing data;
an internal clock signal output circuit for outputting an internal clock signal based on an external clock signal input from outside;
a refresh operation unit for refreshing the memory cell array in accordance with the internal clock signal; and
a refresh request signal output circuit for outputting a refresh request signal to request refresh of the memory cell array,
wherein the internal clock signal output circuit stops output of the internal clock signal on condition that output of the refresh request signal is stopped in the stand-by mode.

6. A semiconductor storage device according to claim 5, wherein
the refresh request signal output circuit outputs the refresh request signal at a constant period.

7. A semiconductor storage device according to claim 5, further comprising:
a logic circuit for outputting a logical operation result between a binary signal indicating the normal operation mode or the stand-by mode and the refresh request signal,
wherein the internal clock signal output circuit controls output of the internal clock signal in accordance with the logical operation result.

8. A semiconductor storage device according to claim 5; wherein
the memory cell array performs data writing or reading in accordance with the internal clock signal.

9. A semiconductor storage device according to claim 5, wherein
the internal clock signal output circuit prevents hazard from occurring in the internal clock signal.

10. A semiconductor storage device according to claim 9, wherein
the internal clock signal output circuit changes the internal clock signal from a first logic level to a second logic level, following a change in the external clock signal at a start of output of the internal clock signal, whereas keeping stopping the internal clock signal upon output of the refresh request signal in a timing when the external clock signal is at the second logic level.

11. A semiconductor storage device according to claim 10, wherein
the internal clock signal output circuit starts outputting the internal clock signal in response to a change in the external clock signal to the second logic level.

12. A semiconductor storage device according to claim 5, wherein
the internal clock signal output circuit changes the internal clock signal from a first logic level to a second logic level, following a change in the external clock signal at a start of output of the internal clock signal, and
the refresh operation unit refreshes the memory cell array in accordance with the internal clock signal and the refresh request signal,
the semiconductor storage device further comprising a circuit for blocking input of the refresh request signal to the refresh operation unit upon output of the refresh request signal in a timing when an output of the internal clock signal output circuit is at the second logic level.

13. A semiconductor storage device according to claim 5, further comprising:
D flip-flop connected between the internal clock signal output circuit and the refresh operation unit, having a D terminal receiving the refresh request signal and Q output input as the refresh request signal to the refresh operation unit in the stand-by mode.

14. A semiconductor storage device, comprising:
a memory cell array including at least one memory cell requiring a refresh;
an external clock terminal for receiving an external clock; and
a buffer coupled to the external clock terminal to receive the external clock, the buffer outputting an internal clock having a first level and a second level different from the first level in response to the change of the external clock during a first mode, and the buffer outputting a single one of the first and second levels while changing the external clock during a second mode, thereby the refresh being conducted by the first and second levels of the internal clock.

15. A semiconductor storage device according to claim 14, further comprising:
a timer for generating a refresh request signal;
a second external terminal for receiving a chip select signal; and
a control gate for generating an internal clock enable signal in response to the refresh request signal and the chip select signal, the internal clock enable signal having a first logic level corresponding to the first mode and a second logic level corresponding to the second mode.

* * * * *